(12) United States Patent
Kim et al.

(10) Patent No.: US 10,579,103 B2
(45) Date of Patent: Mar. 3, 2020

(54) FLEXIBLE DISPLAY

(71) Applicant: LG DISPLAY CO., LTD., Seoul (KR)

(72) Inventors: Dongyoon Kim, Paju-si (KR); Younyeol Yu, Paju-si (KR); Haeyoon Jung, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/811,431

(22) Filed: Nov. 13, 2017

(65) Prior Publication Data

US 2018/0150111 A1 May 31, 2018

(30) Foreign Application Priority Data

Nov. 30, 2016 (KR) .................... 10-2016-0161546

(51) Int. Cl.
*G06F 1/16* (2006.01)
*H01L 51/00* (2006.01)
*H01L 51/52* (2006.01)
*H01L 27/32* (2006.01)

(52) U.S. Cl.
CPC .......... *G06F 1/1652* (2013.01); *H01L 27/326* (2013.01); *H01L 27/3276* (2013.01); *H01L 51/0097* (2013.01); *H01L 51/5243* (2013.01); *H01L 2251/5338* (2013.01); *Y02E 10/549* (2013.01)

(58) Field of Classification Search
CPC ......... H01L 51/0097; H01L 2251/5338; H01L 51/529; H01L 51/525
See application file for complete search history.

(56) References Cited

U.S. PATENT DOCUMENTS

| | | | |
|---|---|---|---|
| 2005/0168143 A1 | 8/2005 | Kum et al. | |
| 2008/0055831 A1* | 3/2008 | Satoh | G02F 1/133305 361/600 |
| 2016/0359132 A1* | 12/2016 | Sun | H01L 51/524 |
| 2017/0060183 A1* | 3/2017 | Zhang | G06F 1/1605 |
| 2017/0142847 A1* | 5/2017 | Park | H05K 5/0017 |
| 2018/0122830 A1* | 5/2018 | Kachatryan | B32B 7/12 |
| 2018/0182993 A1* | 6/2018 | Tang | H01L 51/525 |

FOREIGN PATENT DOCUMENTS

| | | |
|---|---|---|
| CN | 203367284 U | 12/2013 |
| CN | 104600208 A | 5/2015 |

\* cited by examiner

Primary Examiner — Changhyun Yi
(74) Attorney, Agent, or Firm — Seed IP Law Group LLP

(57) ABSTRACT

A flexible display is disclosed. The flexible display includes a substrate having a pixel array and a metal sheet disposed on the substrate and covering the pixel array. The metal sheet includes a groove that extends from one side to the other side of the metal sheet and has a predetermined depth. The groove includes at least one first groove extended in a first direction and at least one second groove extended in a second direction intersecting the first direction.

17 Claims, 12 Drawing Sheets

FLEXIBLE DISPLAY

CROSS-REFERENCE TO RELATED APPLICATION

This application claims the priority benefit of Korean Patent Application No. 10-2016-0161546 filed Nov. 30, 2016, which is incorporated herein by reference for all purposes as if fully set forth herein.

BACKGROUND

Technical Field

The present disclosure relates to a flexible display.

Description of the Related Art

With the development of information technology, the market of display devices used as a connection medium between a user and information is growing. Thus, the use of display devices, such as an organic light emitting diode (OLED) display, a liquid crystal display (LCD), and a plasma display panel (PDP), is on the rise.

An OLED display is a self-emission display device. Thus, the OLED display can be manufactured to have lower power consumption and a thinner profile than a liquid crystal display which requires a backlight unit. In addition, the OLED displays have advantages of a wide viewing angle and a fast response time. As a process technology of the OLED displays has been developed to mass-produce large-screen OLED displays, the OLED displays have expanded its market while competing with the liquid crystal displays.

Each pixel of an OLED display includes an organic light emitting diode (OLED) having a self-emitting structure. The OLED display may be variously classified depending on kinds of emission materials, an emission method, an emission structure, a driving method, and the like. For example, the OLED display may be classified into a fluorescent display and a phosphorescent display depending on the emission method. Further, the OLED display may be classified into a top emission display and a bottom emission display depending on the emission structure. In addition, the OLED display may be classified into a passive matrix OLED (PMOLED) display and an active matrix OLED (AMOLED) display depending on the driving method.

As flexible displays have been recently commercialized, various types of flexible displays have been developed. The flexible displays can be implemented in various forms including a bendable display, a foldable display, a rollable display, a curved display, and the like. The flexible displays may be applied not only to a mobile device, such as a smart phone and a tablet PC, but also to a television, an automobile display, and a wearable device. An application field of the flexible displays is expanding.

BRIEF SUMMARY

The present disclosure teach how to provide a flexible display with a metal sheet.

In one aspect, there is provided a flexible display including a substrate having a pixel array, and a metal sheet disposed on the substrate and covering the pixel array. The metal sheet includes a groove that extends from one side to the other side of the metal sheet and has a predetermined depth.

The groove includes at least one first groove extended in a first direction, and at least one second groove extended in a second direction intersecting the first direction.

One of the first direction and the second direction is the same as a direction of a bending axis of the substrate.

The first direction and the second direction are perpendicular to each other.

The flexible display has a stack structure in which a plurality of layers is stacked, and includes a neutral surface, a first area positioned on or below the neutral surface, and a second area positioned below or on the neutral surface differently from the first area. A compressive stress is applied to the first area, and a tensile stress is applied to the second area. A position of the neutral surface in a formation area of the groove is different from a position of the neutral surface in a non-formation area of the groove.

The plurality of layers includes a display element layer including an organic light emitting diode. In the formation area of the groove, the display element layer is positioned on the neutral surface or positioned in the first area.

The flexible display further includes a back film positioned below the substrate.

In another aspect, there is provided a flexible display including a substrate having a pixel array, and a metal sheet disposed on the substrate and covering the pixel array, wherein the metal sheet includes at least one first groove that is partially recessed inward from an upper surface of the metal sheet and is extended in a first direction to penetrate opposite sides of the metal sheet.

The metal sheet further includes at least one second groove that is partially recessed inward from the upper surface of the metal sheet and is extended in a second direction intersecting the first direction to penetrate opposite sides of the metal sheet.

The metal sheet further includes at least one nth groove that is partially recessed inward from the upper surface of the metal sheet and is extended in a direction inclined from the first direction and the second direction at a predetermined angle to penetrate opposite sides of the metal sheet, where n is a natural number equal to or greater than 3.

The pixel array includes emission portions, and non-emission portions positioned outside the emission portions. The first groove is disposed at a location corresponding to the emission portions disposed along the first direction.

A width of the first groove corresponds to a width of the emission portion.

The pixel array includes emission portions, and non-emission portions positioned outside the emission portions. The second groove is disposed at a location corresponding to the emission portions disposed along the second direction.

A width of the second groove corresponds to a width of the emission portion.

BRIEF DESCRIPTION OF THE SEVERAL VIEWS OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Reference will now be made in detail to embodiments of the disclosure, examples of which are illustrated in the accompanying drawings. Wherever possible, the same reference numbers will be used throughout the drawings to refer to the same or like parts. Detailed descriptions of known arts will be omitted if such may mislead the embodiments of the disclosure.

The terms "first," "second," etc. may be used to describe various components, but the components are not limited by such terms. The terms are used only for the purpose of distinguishing one component from other components. For example, a first component may be designated as a second component, and vice versa, without departing from the scope of the present disclosure. A singular expression can include a plural expression as long as it does not have an apparently different meaning in context.

Figure 1:
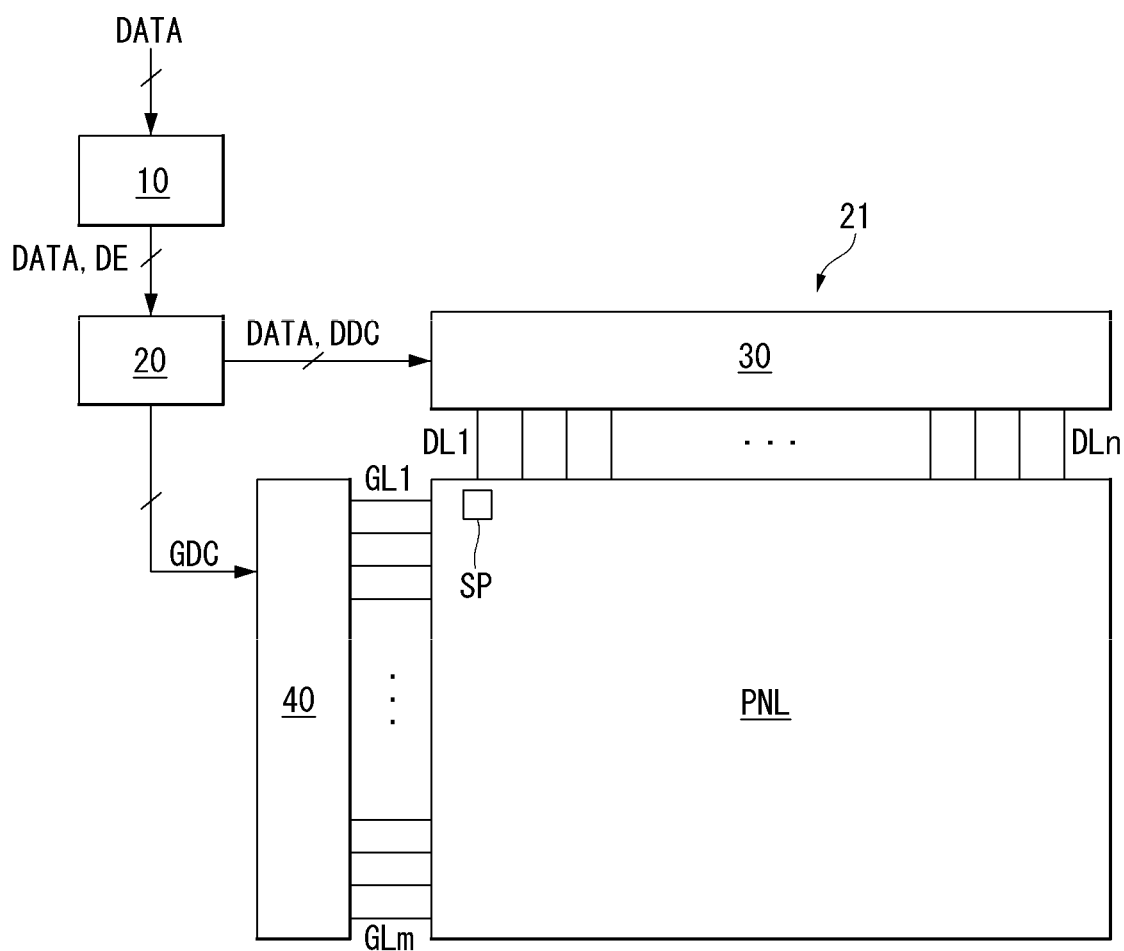
FIG. 1 is a schematic block diagram of a flexible display according to an embodiment of the disclosure.
Figure 2:
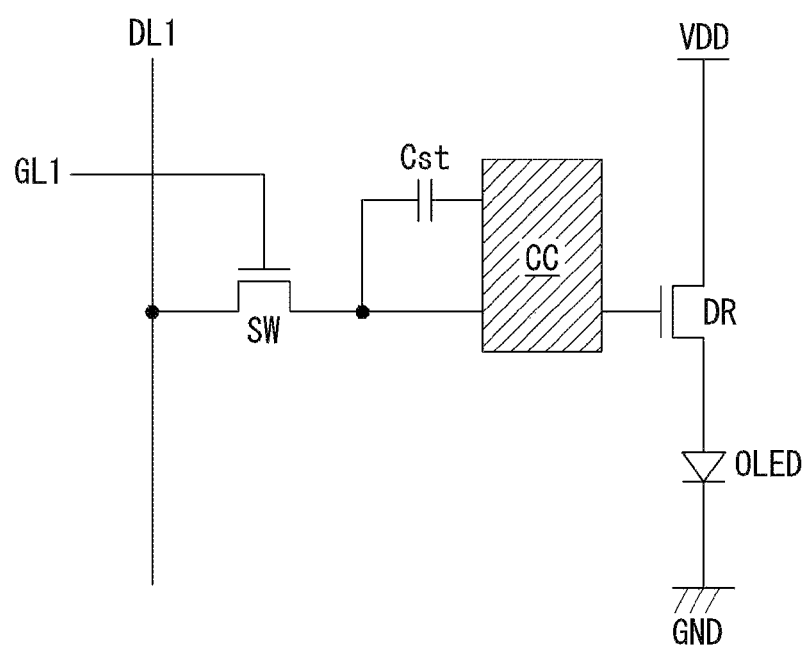
FIG. 2 illustrates a first example of a circuit configuration of a subpixel.
Figure 3:
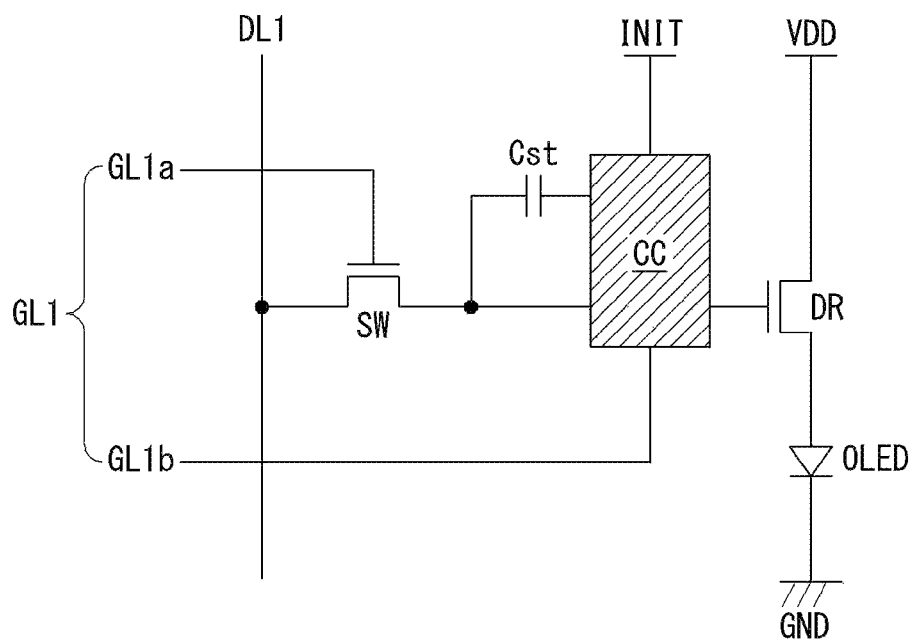
FIG. 3 illustrates a second example of a circuit configuration of a subpixel.
Figure 4:
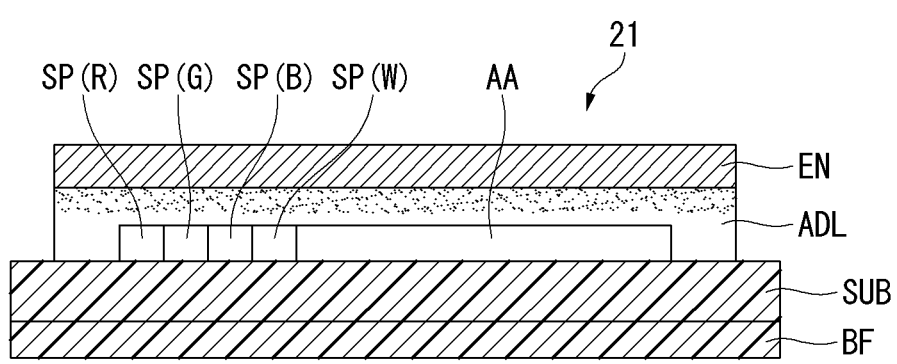
FIG. 4 is a schematic cross-sectional view of a flexible display according to an embodiment of the disclosure.

FIG. 1 is a schematic block diagram of a flexible display 21 according to an embodiment of the disclosure. FIG. 2 illustrates a first example of a circuit configuration of a subpixel. FIG. 3 illustrates a second example of a circuit configuration of a subpixel. FIG. 4 is a schematic cross-sectional view of a flexible display according to an embodiment of the disclosure.

Referring to FIG. 1, a flexible display according to an embodiment of the disclosure includes an image processing unit 10, a timing controller 20, a data driver 30, a gate driver 40, and a display panel PNL.

The image processing unit 10 outputs a data signal DATA and a data enable signal DE supplied from the outside. The image processing unit 10 may output one or more of a vertical sync signal, a horizontal sync signal, and a clock signal in addition to the data enable signal DE. For convenience of explanation, these signals are not shown. The image processing unit 10 is formed on a system circuit board as an integrated circuit (IC).

The timing controller 20 receives the data signal DATA and driving signals including the data enable signal DE or the vertical sync signal, the horizontal sync signal, the clock signal, etc. from the image processing unit 10.

The timing controller 20 outputs a gate timing control signal GDC for controlling operation timing of the gate driver 40 and a data timing control signal DDC for controlling operation timing of the data driver 30 based on the driving signals. The timing controller 20 may be formed on a control circuit board as an IC.

The data driver 30 samples and latches the data signal DATA received from the timing controller 20 in response to the data timing control signal DDC supplied from the timing controller 20 and converts the sampled and latched data signal DATA using gamma reference voltages. The data driver 30 outputs the converted data signal DATA to data lines DL1 to DLn. The data driver 30 is attached to a substrate as an IC.

The gate driver 40 outputs a gate signal while shifting a level of a gate voltage in response to the gate timing control signal GDC supplied from the timing controller 20. The gate driver 40 outputs the gate signal to gate lines GL1 to GLm. The gate driver 40 is formed on a gate circuit board as an IC or is formed on the display panel PNL in a gate-in-panel (GIP) manner.

The display panel PNL displays an image in response to the data signal DATA and the gate signal respectively received from the data driver 30 and the gate driver 40. The display panel PNL includes subpixels SP for displaying an image.

As shown in FIG. 2, each subpixel may include a switching transistor SW, a driving transistor DR, a compensation circuit CC, and an organic light emitting diode (OLED). The organic light emitting diode operates to emit light with a driving current generated by the driving transistor DR. The organic light emitting diode includes a first electrode serving as an anode, a second electrode serving as a cathode, and an emission layer formed of an organic material between the first electrode and the second electrode. Thus, the organic light emitting diode is configured to form hole-electron pairs, i.e., excitons by combining holes received from the first electrode and electrons received from the second electrode inside the emission layer and emit light by energy generated when the excitons return to a ground level.

The switching transistor SW performs a switching operation so that a data signal supplied through a first data line DL1 is stored in a capacitor Cst as a data voltage in response to a gate signal supplied through a first gate line GL1. The driving transistor DR enables a driving current to flow between a high potential power line VDD and a low potential power line GND based on the data voltage stored in the capacitor Cst. The compensation circuit CC is a circuit for compensating for a threshold voltage of the driving transistor DR. A capacitor connected to the switching transistor SW or the driving transistor DR may be mounted inside the compensation circuit CC.

The compensation circuit CC includes one or more thin film transistors and a capacitor. Configuration of the compensation circuit CC may be variously selected depending on a compensation method. A brief description of the compensation circuit CC will be made. Various different types of compensation circuits CC can be used, many of which are known in the art. One example will now be provided.

As shown in FIG. 3, a subpixel including the compensation circuit CC may further include a signal line and a power line for driving a compensation TFT and supplying a predetermined signal or electric power. The added signal line may be defined as a 1-2 gate line GL1b for driving the compensation TFT included in the subpixel. The added power line may be defined as an initialization power line INIT for initializing a predetermined node of the subpixel to a predetermined voltage. However, this is merely an example, and embodiments are not limited thereto.

FIGS. 2 and 3 illustrate that one subpixel includes the compensation circuit CC by way of example. However, the compensation circuit CC may be omitted when an object (for example, the data driver 30) to be compensated is positioned outside the subpixel. The subpixel has a configuration of 2T(Transistor)1C(Capacitor) in which the switching transistor SW, the driving transistor DR, the capacitor, and the organic light emitting diode are provided. However, when the compensation circuit CC is added to the subpixel, the subpixel may have various configurations such as 3T1C, 4T2C, 5T2C, 6T2C, 7T2C, and the like.

Also, FIGS. 2 and 3 illustrate that the compensation circuit CC is positioned between the switching transistor SW and the driving transistor DR by way of an example. However, the compensation circuit CC may be further positioned between the driving transistor DR and the organic light emitting diode. The position and the structure of the compensation circuit CC are not limited to the ones illustrated in FIGS. 2 and 3.

Referring to FIG. 4, the flexible display 21 according to the embodiment of the disclosure includes a substrate SUB including a pixel array and a metal sheet EN.

The substrate SUB may be made of a flexible material capable of being bent. For example, the substrate SUB may be made of polyimide (PI), polyethylene terephthalate (PET), polyethylene naphthalate (PEN), polycarbonate (PC), polyethersulfone (PES), polyarylate (PAR), polysulfone (PSF), cyclic-olefin copolymer (COC), and the like.

The pixel array includes a display area AA including a plurality of subpixels SP. The subpixels SP are arranged in the display area AA in order of red (R), green (G), and blue (B) subpixels or in order of red (R), green (G), blue (B), and white (W) subpixels to implement full color. The subpixels SP may be partitioned by the gate lines and the data lines intersecting each other.

The metal sheet EN is positioned on the pixel array. The metal sheet EN is configured to cover the pixel array, in order to prevent moisture or oxygen from entering the inside of the subpixels SP.

The metal sheet EN serves as an encapsulation layer. The metal sheet EN includes a metal material. For example, the metal sheet EN may be made of invar (nickel-iron alloy) which is an alloy of iron (Fe) and nickel (Ni) and has a low thermal expansion coefficient, or steel use stainless (SUS), but is not limited thereto. The embodiment of the disclosure includes the metal sheet EN made of the metal material and thus can efficiently prevent moisture and oxygen from entering the inside of the subpixels SP. Hence, the embodiment of the disclosure can provide the flexible display with the improved product reliability and the improved stability.

The metal sheet EN may be attached to the plastic substrate SUB through an adhesive layer ADL. The adhesive layer ADL is configured to cover the pixel array. The adhesive layer ADL may have a predetermined thickness and function to buffer an external impact. Further, the adhesive layer ADL having the predetermined thickness can provide additional protection from moisture by being a further sealing layer and by increasing a length of an inflow path of moisture and oxygen to the display area AA.

The flexible display may further include a back film BF. The back film BF is positioned below the substrate SUB and supports the substrate SUB. The back film BF can reinforce rigidity of the substrate SUB and can prevent moisture and oxygen from entering the lower part of the substrate SUB. The back film BF may be made of a polymer-based material.

Figure 5:
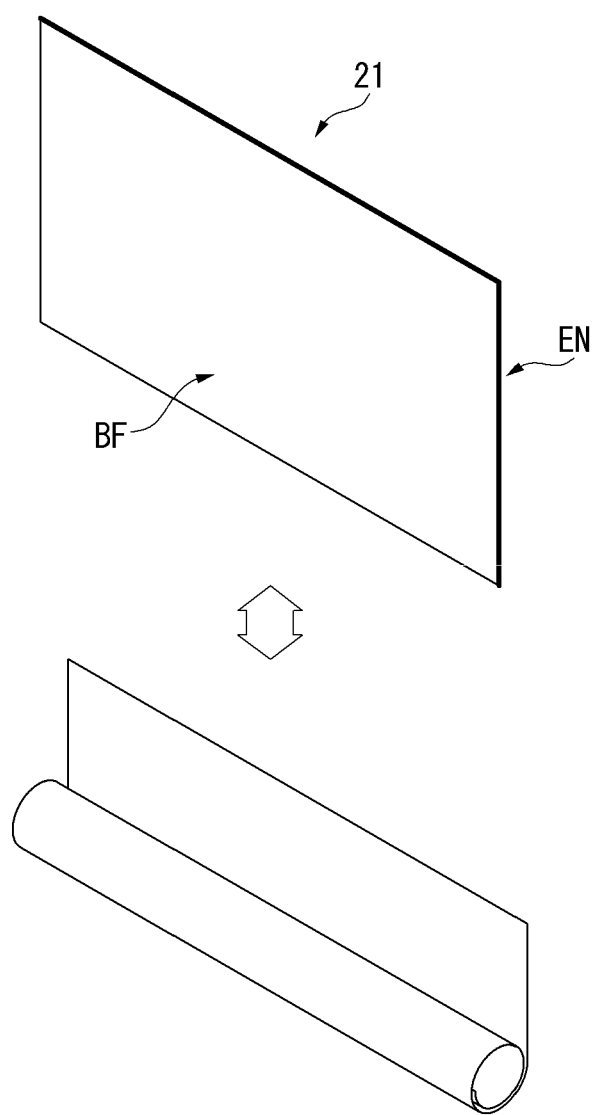
FIG. 5 illustrates an example of use of a flexible display according to an embodiment of the disclosure.

FIG. 5 illustrates an example of use of the flexible display 21 according to the embodiment of the disclosure.

Referring to FIG. 5, the flexible display 21 may be rolled (or wound) and unrolled (or unwound). Namely, the flexible display is given a predetermined flexibility and can easily perform repeatedly a rolling operation and an unrolling operation.

A state change (e.g., the rolling and the unrolling) of the flexible display 21 may be performed by a physical external force directly provided by a user. For example, the user may grasp one end of the flexible display 21 and apply a force to the flexible display 21, thereby performing the state change of the flexible display 21. The state change of the flexible display 21 may also be controlled by a controller in response to a predetermined specific signal. Namely, the state change of the flexible display 21 may be controlled by a selected driving device, a rotating shaft, a selected driving circuit, and the like.

Figure 6:
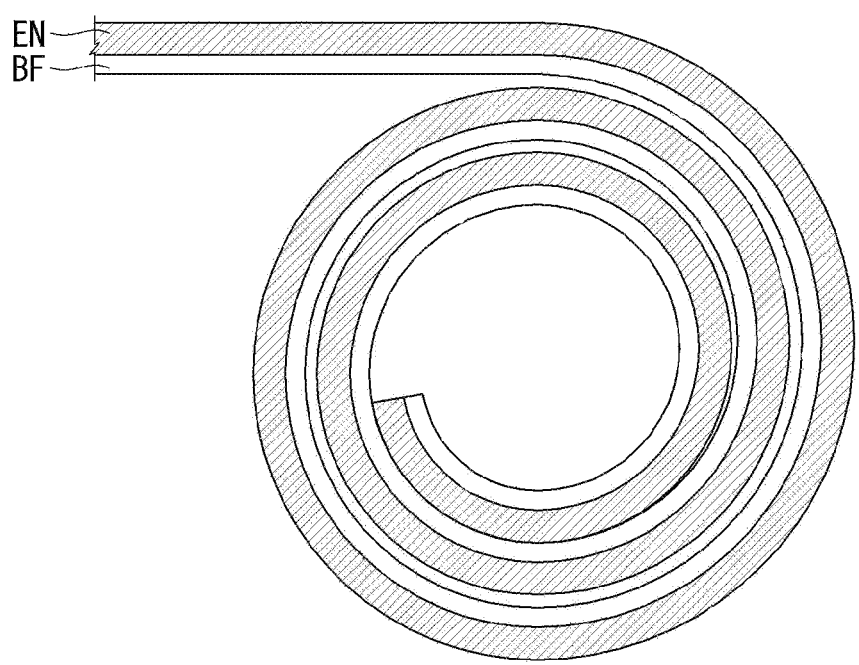
FIG. 6 illustrates problem of a flexible display.

FIG. 6 illustrates a problem of general flexible displays of the prior art.

Referring to FIG. 6, the metal sheet EN positioned at an upper part of the flexible display and the back film BF positioned at a lower part of the flexible display contact each other in a state where the flexible display is rolled. Because the metal sheet EN and the back film BF contact each other when the flexible display is rolled, moisture generated between the metal sheet EN and the back film BF in a high temperature and high humidity environment is not discharged and is confined. In this instance, the metal sheet EN may be oxidized by the moisture remaining between the metal sheet EN and the back film BF, causing a problem of corrosion. The metal sheet EN and the back film BF may be adhered to each other during the corrosion of the metal sheet EN and may not be detached from each other. In this instance, when a flexible display panel is forcibly unrolled, there may be a problem that one or more layers having a low adhesive strength to each other are peeled off. In particular, peeling at an interface between the emission layer and the cathode electrode constituting the organic light emitting diode may occur, which will create a problem. Other layers may also delaminate, causing failure of the flexible display.

Figure 7A:
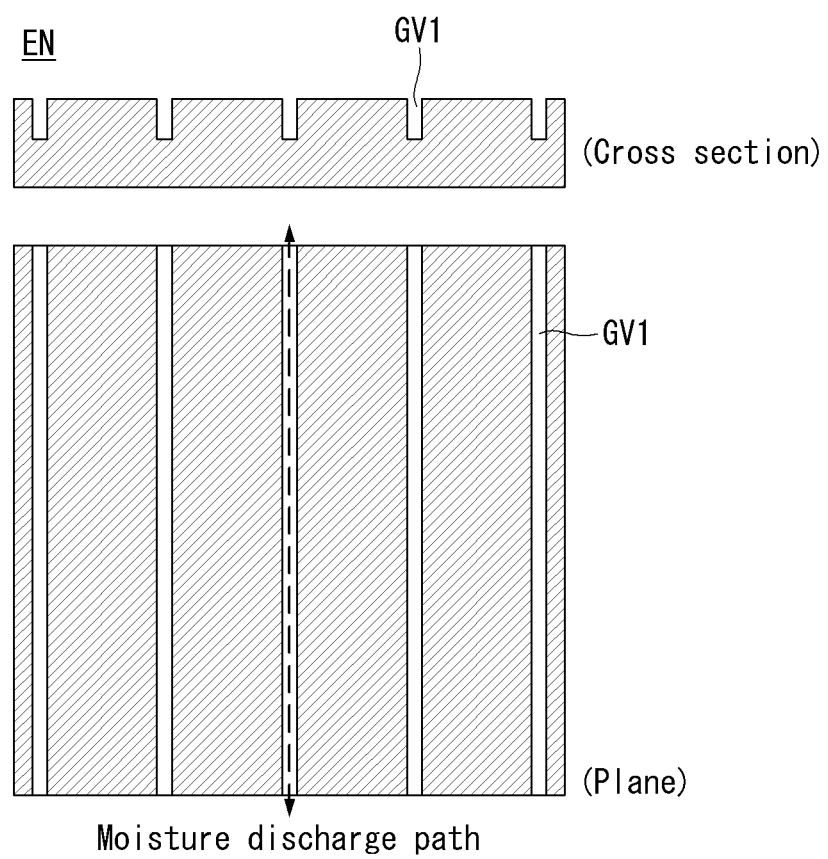
FIGS. 7A, 7B, and 8 illustrate a metal sheet according to an embodiment of the disclosure.
Figure 7B:
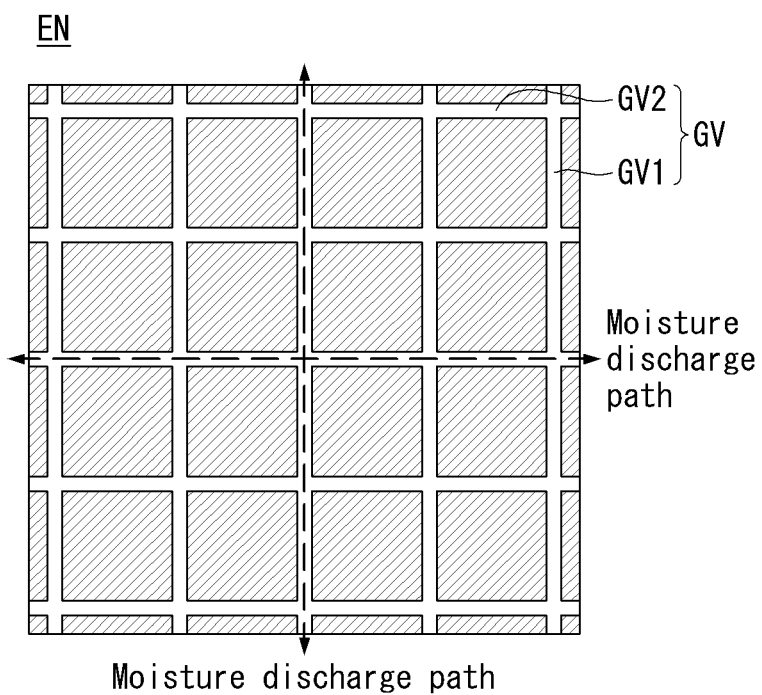
Figure 8:
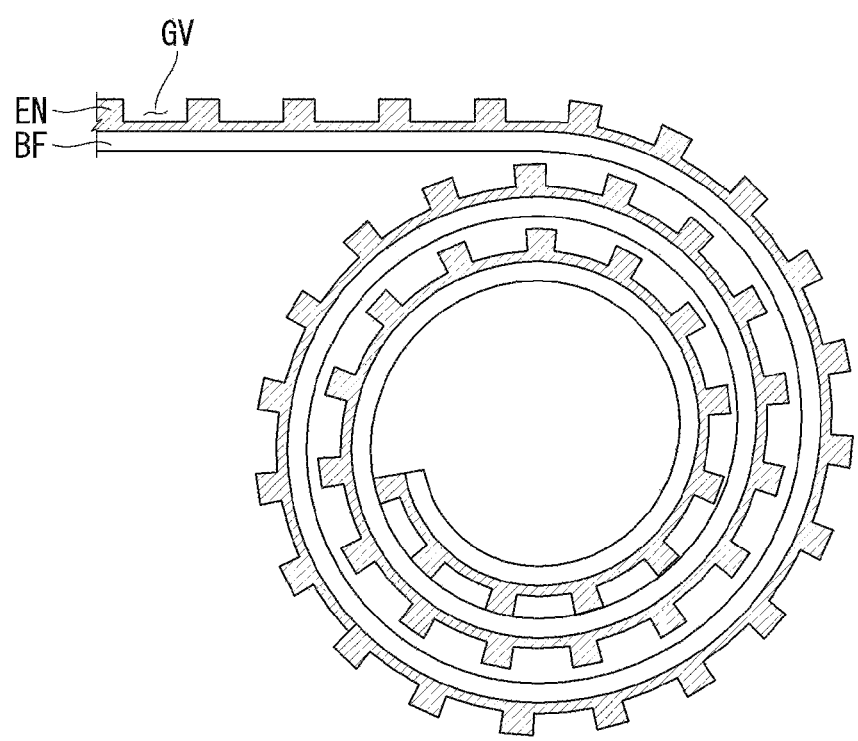

FIGS. 7A, 7B, and 8 illustrate a metal sheet according to an embodiment of the disclosure.

Referring to FIGS. 7A, 7B, and 8, the metal sheet EN includes one or more grooves GV. The groove GV has a shape partially recessed inward from an upper surface of the metal sheet EN. Namely, the groove GV is extended from one side to the other side of the metal sheet EN and has a predetermined width and a predetermined depth. FIGS. 7A, 7B, and 8 illustrate that a cross section of the groove GV has a substantially rectangular shape, by way of example. However, embodiments are not limited thereto. The groove GV may have any shape as long as moisture generated in a high temperature and high humidity environment can be easily discharged to the outside, away from the metal layer EN. The groove GV may be used as a moisture discharge path.

As shown in FIG. 7A, the groove GV may include a first groove GV1 that is extended in a first direction so that it extends fully from one side to the other side of the metal sheet EN. The metal sheet EN may include a plurality of first grooves GV1. At least one of the plurality of first grooves GV1 may have a different shape from at least another of the plurality of first grooves GV1. At least one of the plurality of first grooves GV1 may have a different width and/or a different depth from at least another of the plurality of first grooves GV1. The plurality of first grooves GV1 may be spaced apart from each other by a predetermined distance. A distance between the adjacent first grooves GV1 may vary depending on a formation position of the first grooves GV1.

As shown in FIG. 7B, the groove GV may include a second groove GV2 that is extended in a second direction intersecting the first direction so that it extends fully from one side to the other side of the metal sheet EN. For example, the second direction may be perpendicular to the first direction. The metal sheet EN may include a plurality of second grooves GV2. At least one of the plurality of second grooves GV2 may have a different shape from at least another of the plurality of second grooves GV2. At least one of the plurality of second grooves GV2 may have a different width and/or a different depth from at least another of the plurality of second grooves GV2. The plurality of second grooves GV2 may be spaced apart from each other by a predetermined distance. A distance between the adjacent second grooves GV2 may vary depending on a formation position of the second grooves GV2.

One of the first direction and the second direction may be the same as a direction of a bending axis of the flexible display (or the substrate SUB). However, the embodiments are not limited thereto.

The flexible display according to the embodiment of the disclosure can efficiently discharge the moisture generated in the high temperature and high humidity environment to the outside through the groove GV included in the metal sheet EN. Hence, the embodiment of the disclosure can provide the flexible display with the improved product reliability and the improved stability.

The flexible display according to the embodiment of the disclosure can control a thickness of the metal sheet EN through the groove GV provided in the metal sheet EN, thereby sufficiently securing the flexibility of the flexible display. More specifically, the metal sheet EN among a plurality of layers constituting the flexible display is relatively thicker than other layers. The thickness of the metal sheet EN and a thickness of the adhesive layer ADL (see FIG. 4) may be substantially greater than a sum of thicknesses of other layers. Thus, the adjustment of the thickness of the metal sheet EN is an important factor in securing the flexibility of the flexible display.

According to the various embodiments of the disclosure, the width, the depth, the shape, etc. of the groove GV included in the metal sheet EN, can be selected and, if needed, adjusted and varied for each particular design so that the flexibility of the flexible display 21 can be sufficiently secured. Further, the embodiment of the disclosure can vary or otherwise adjust the number of the grooves GV. Hence, the embodiment of the disclosure can provide that the flexible display 21 can be rolled with various curvatures, irrespective of the rigidity of the metal sheet EN while efficiently preventing the penetration of moisture and oxygen using the metal sheet EN.

The flexible display 21 according to the embodiment of the disclosure can control the thickness of the metal sheet EN through the groove GV provided in the metal sheet EN, thereby controlling a neutral surface (or a neutral plane) at a desired position. More specifically, the neutral surface, sometimes called the neutral plane, is that internal location in the flexible display 21 that is in a stress state of zero when the flexible display is rolled. The term "neutral surface" refers to a surface (usually an internal surface) that is bent while maintaining its original length without being stretched or shrunk when a bending moment is applied. In this context, use of the word "surface" does not require that the structure referred to is an exposed surface. When the flexible display is rolled, a compressive stress acts on the inside of bending curvature of the flexible display 21 and a tensile stress acts on the outside of the bending curvature. The neutral plane, also called the internal neutral surface, is that location that is not placed under either tensile or compressive stress when the display is rolled up. A crack is more likely to occur in an element disposed in an area on which the tensile stress acts, than an element disposed in an area on which the compressive stress acts. Namely, when the elements are bent, the element subjected to the tensile stress during the bending is more vulnerable to the crack generation than the element subjected to the compressive stress during the bending. Thus, the embodiment of the disclosure provides a control of the location of the neutral surface in a stack structure of the flexible display and distributes an internal stress, in order to implement the flexible display 21 with the stability and long term reliability.

The various embodiments of the disclosure can control the location of the neutral surface, thereby reducing, and in some cases, minimizing a stress applied to the layer vulnerable to the crack generation or preventing the tensile stress from being applied to the layer vulnerable to the crack generation. Hence, the embodiment of the disclosure can provide the flexible display 12 with a structure that is strong against the stress provided when the flexible display is rolled.

Figure 9:
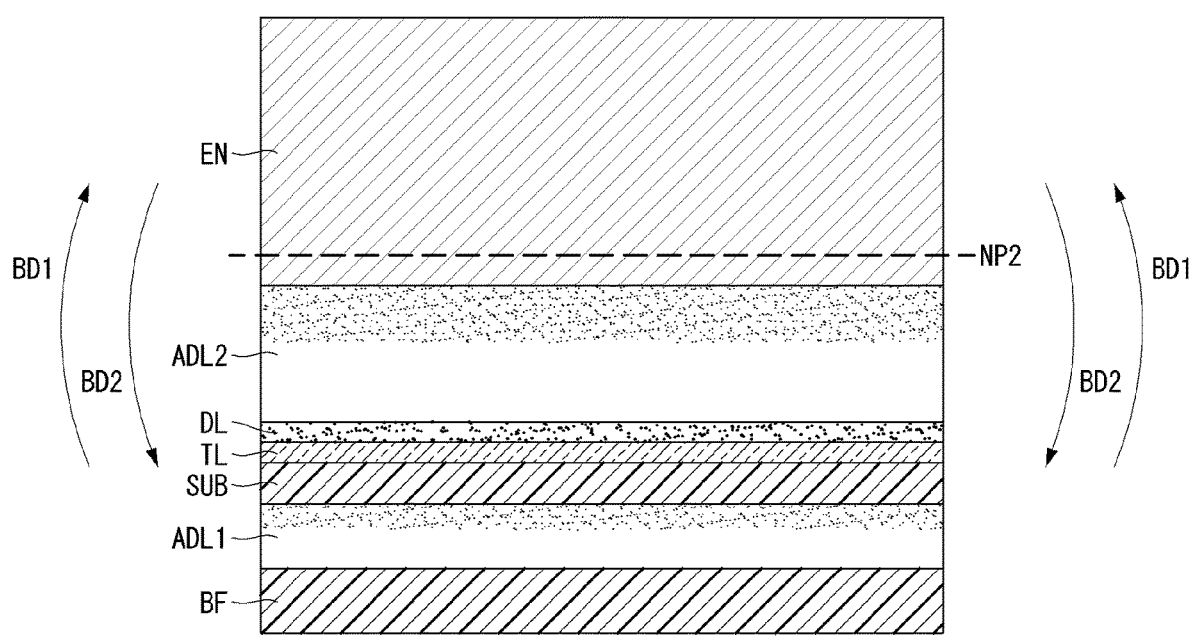
FIG. 9 illustrates an example of a stack structure of a flexible display according to a comparative example.
Figure 10:
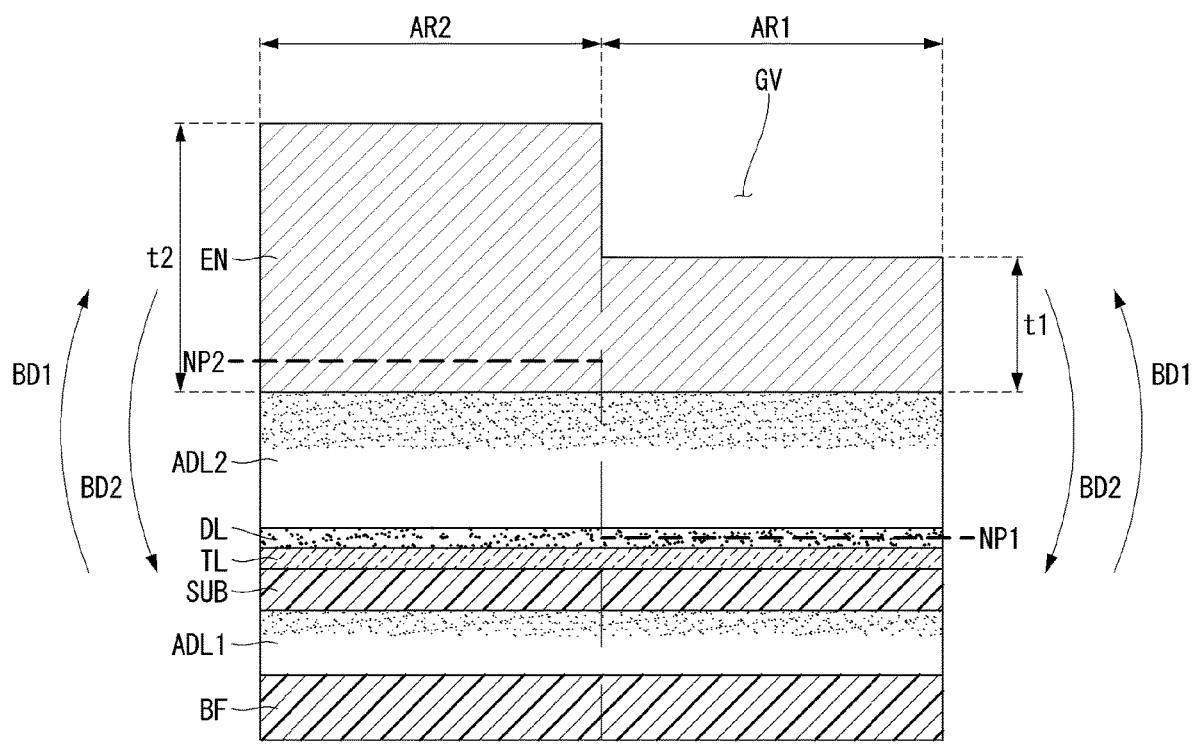
FIG. 10 illustrates an example of a stack structure of a flexible display according to an embodiment of the disclosure.
Figure 11:
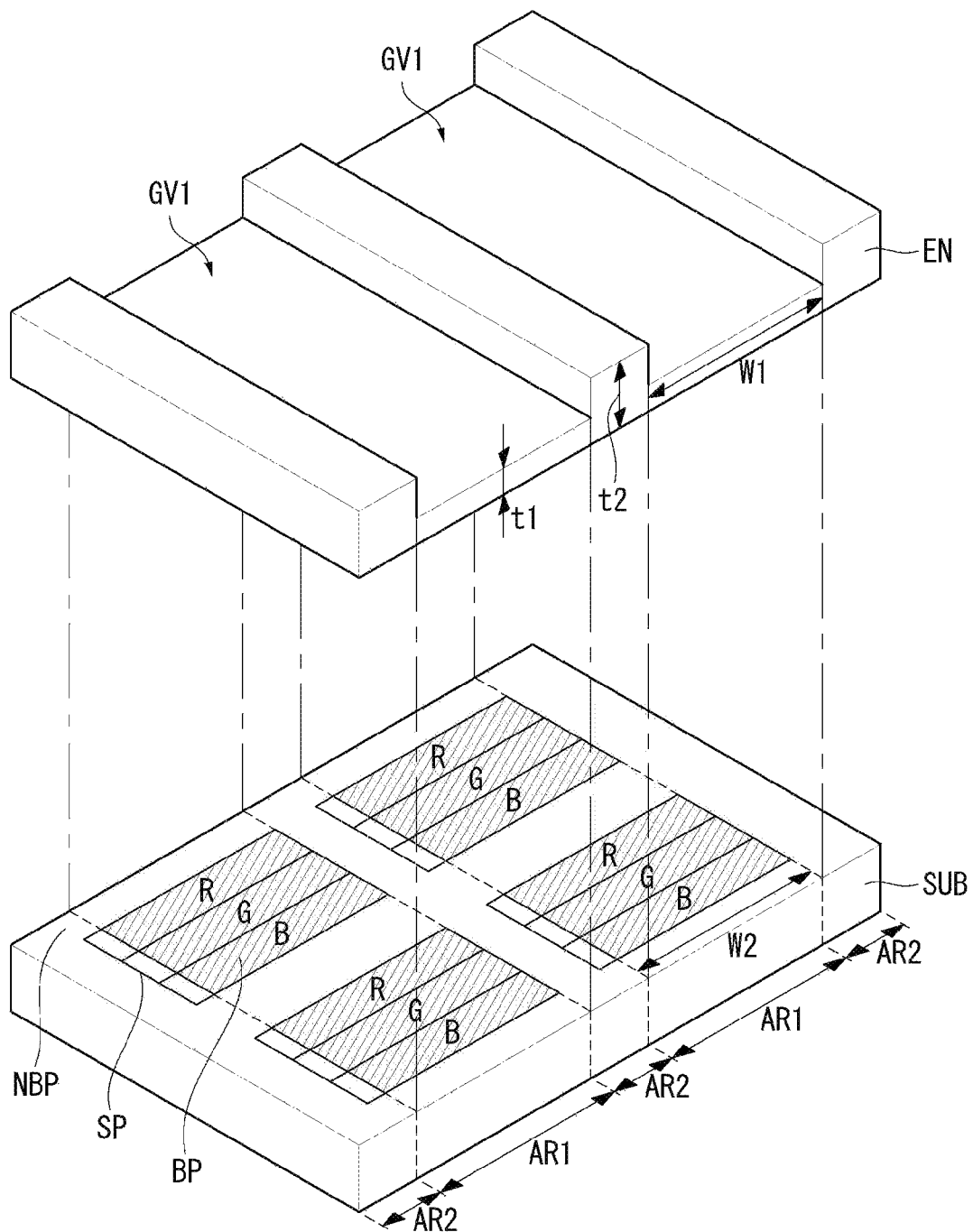
FIGS. 11 and 12 illustrate a relationship between a groove and an emission portion according to an embodiment of the disclosure.
Figure 12:
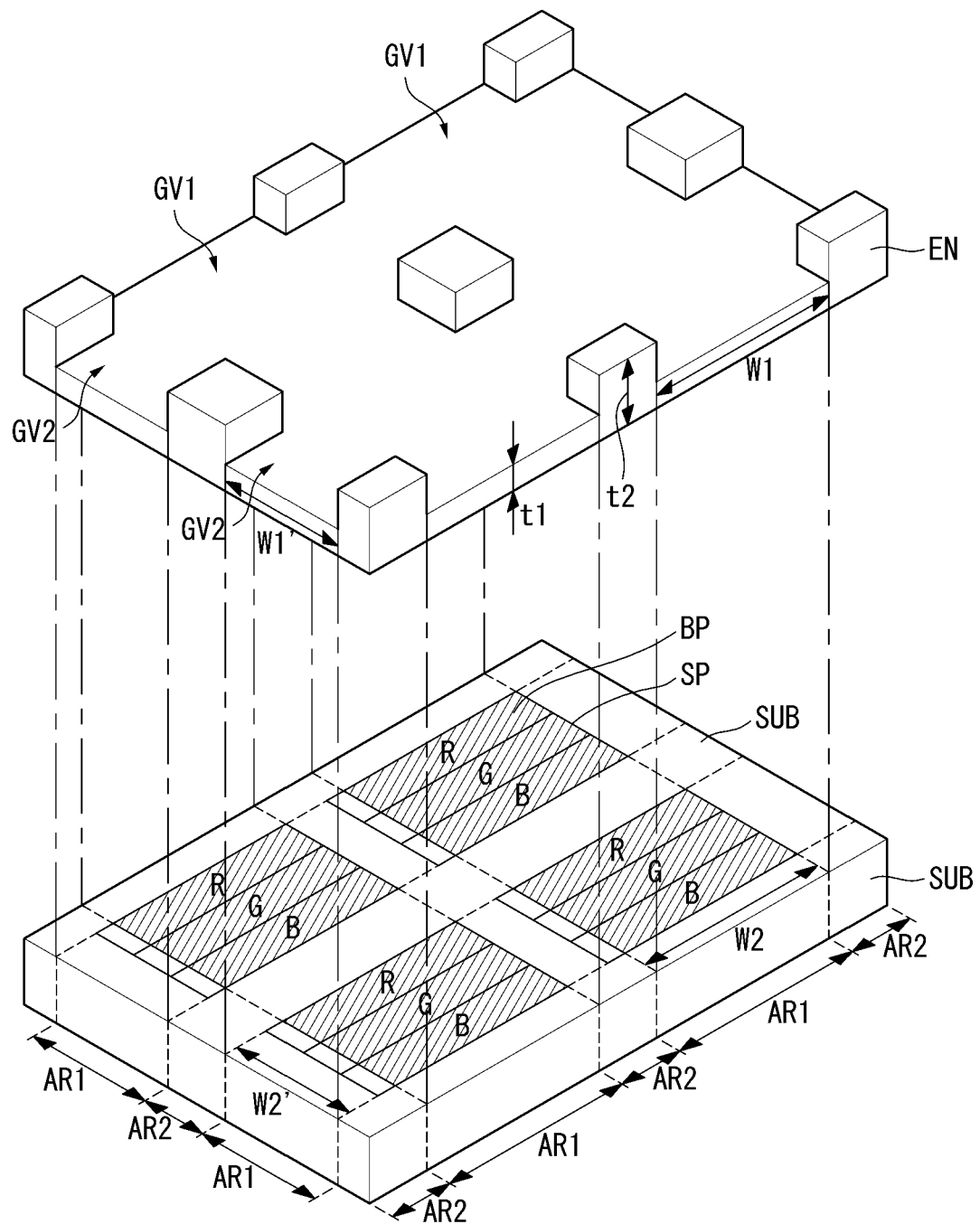

Characteristics of a flexible display according to an embodiment of the disclosure are described in detail below. FIG. 9 illustrates an example of a stack structure of a flexible display according to a comparative example. FIG. 10 illustrates an example of a stack structure of a flexible display according to an embodiment of the disclosure. FIGS. 11 and 12 illustrate a relationship between a groove and an emission portion according to an embodiment of the disclosure.

Referring to FIG. 9, a flexible display according to a comparative example includes a substrate SUB, a transistor layer TL, a display element layer DL, and a metal sheet EN.

The substrate SUB may be made of a flexible material. The flexible display according to the comparative example may further include a back film BF that is positioned below the substrate SUB and supports the substrate SUB. The back film BF may be attached to the substrate SUB through a first adhesive layer ADL1 interposed between the substrate SUB and the back film BF.

The transistor layer TL is disposed on the substrate SUB. Transistors for driving organic light emitting diodes included in the display element layer DL are disposed in transistor layer TL. The transistors may be implemented as a transistor including a silicon semiconductor, and may be implemented as a transistor including an oxide semiconductor. The silicon semiconductor may include amorphous silicon or crystallized polycrystalline silicon. Further, the transistors may be implemented as various structures including a bottom gate structure, a top gate structure, a double gate structure, and the like.

The display element layer DL is disposed on the transistor layer TL. The organic light emitting diodes driven by the transistors are disposed in the display element layer DL. Each organic light emitting diode includes an anode electrode, a cathode electrode, and an organic compound layer between the anode electrode and the cathode electrode. The organic compound layer includes an emission layer and may further include one or more common layers, if necessary or desired. Namely, the organic compound layer may further include at least one of a hole injection layer, a hole transport layer, an electron transport layer, and an electron injection layer.

The metal sheet EN is disposed on the display element layer DL. The metal sheet EN on the display element layer DL prevents the penetration of moisture and oxygen from the outside. The metal sheet EN may be attached to the display element layer DL through a second adhesive layer ADL2 interposed between the display element layer DL and the metal sheet EN.

In a structure shown in FIG. 9 according to the comparative example, the neutral surface NP2 is positioned at an almost lower end of the metal sheet EN. When the flexible display is rolled along a first bending direction BD1, a tensile stress is applied to the display element layer DL. Hence, the emission layer may be torn out, or a peeling phenomenon may occur at an interface between the emission layer and the cathode electrode.

When the flexible display is rolled along a second bending direction BD2, a compressive stress is applied to the display element layer DL. In this instance, the strong compressive stress may be applied to the display element layer DL because the neutral surface NP2 is far away from the display element layer DL. Namely, when the flexible display is rolled, a magnitude of the tensile stress and a magnitude of the compressive stress are determined in proportion to a distance from the neutral surface NP2. Therefore, in the structure of the comparative example, the strong compressive stress is applied to the display element layer DL that is far away from the neutral surface NP2. Hence, the emission layer may be torn out, or a peeling phenomenon may occur at an interface between the emission layer and the cathode electrode.

Referring to FIG. 10, a flexible display 21 according to an embodiment of the disclosure includes a substrate SUB, a transistor layer TL, a display element layer DL, and a metal sheet EN. The other layers in the stack structure besides the metal layer EN of the flexible display 21 according to the embodiment of the disclosure may be substantially the same as a stack structure of the flexible display according to the comparative example.

The metal sheet EN includes a first area AR1 and a second area AR2. A groove GV is formed in the first area AR1, and the groove GV is not formed in the second area AR2. Thus, the first area AR1 has a first thickness t1, and the second area AR2 has a second thickness t2 greater than the first thickness t1. A position of a neutral surface NP1 in the first area AR1 is different from a position of a neutral surface NP2 in the second area AR2. The depth of the groove is therefore the difference between t1 and t2. The areas having a thickness of t2 are those of the standard thickness, where no groove is present.

In the first area AR1 having the groove GV, the neutral surface NP1 of the flexible display is positioned adjacent to, or fully within, the display element layer DL. Namely, in the first area AR1 in which the location of the neutral surface NP1 is controlled, neither a tensile stress nor a compressive stress is applied to the display element layer DL, or in some cases, a weak compressive stress is applied to the display element layer DL. Hence, the embodiment of the disclosure can minimize or prevent an emission layer from being torn out, or a peeling phenomenon from occurring at an interface between the emission layer and a cathode electrode. The surfaces of the layer DL are all internal to the stack. Further, the embodiment of the disclosure can locally control the position and location of the neutral surfaces NP1 and NP2 at a desired position by selectively forming the groove GV at least desired location at a particular selected depth.

Referring to FIGS. 11 and 12, the flexible display according to the embodiment of the disclosure includes the substrate SUB having a pixel array and the metal sheet EN. The pixel array may be defined to include the transistor layer TL and the display element layer DL shown in FIG. 10. The pixel array includes an emission portion BP and a non-emission portion NBP. The emission portion BP is a region where light emitted from an organic light emitting diode is emitted to the outside. The emission portion BP may be defined inside subpixels SP arranged in a matrix.

The first area AR1 of the metal sheet EN is positioned corresponding to the emission portion BP, and the second area AR2 of the metal sheet EN is positioned corresponding to the non-emission portion NBP. A width W1 of the groove GV formed in the metal sheet EN may correspond to a width W2 of the emission portion BP.

More specifically, as shown in FIG. 11, the metal sheet EN may include first grooves GV1 extended in a first direction. The first groove GV1 may be formed at a location corresponding to the emission portions BP disposed along the first direction and may have a width W1 corresponding to a width W2 of the emission portion BP disposed along the first direction.

Alternatively, as shown in FIG. 12, the metal sheet EN may include first grooves GV1 extended in the first direction and second grooves GV2 extended in a second direction. The first groove GV1 may be formed at a location corresponding to the emission portions BP disposed along the first direction and may have a width W1 corresponding to a width W2 of the emission portion BP disposed along the first direction. The second groove GV2 may be formed at a location corresponding to the emission portions BP disposed along the second direction and may have a width W1' corresponding to a width W2' of the emission portion BP disposed along the second direction.

Although not shown, the metal sheet EN may further include an nth groove GVn extended in a direction inclined from the first direction and the second direction at a predetermined angle, where n is a natural number equal to or greater than 3. The embodiment of the disclosure properly selects an extension direction, the number, a shape, a depth, etc. of the grooves GV and, thus, can form a moisture discharge path at a desired location while at the same time controlling the location of the neutral plan to thus increase the reliability of the flexible display.

As described above, because the neutral surface is controlled in the first area AR1, the embodiment of the disclosure can minimize or prevent the emission layer in the emission portion BP from being torn out, or the peeling phenomenon from occurring at the interface between the emission layer and the cathode electrode. Thus, the embodiment of the disclosure can provide the flexible display with a minimized drive failure.

The metal sheet EN is formed by alternately disposing the first areas AR1 and the second areas AR2 each having a different thickness, and a stepped portion is formed between the first area AR1 and the second area AR2. The moisture may be discharged to the outside through a space provided by the stepped portion. Hence, the embodiment of the disclosure can provide the flexible display with the improved product reliability and the improved stability.

Although aspects have been described with reference to a number of illustrative aspects thereof, it should be understood that numerous other modifications and aspects can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The various embodiments described above can be combined to provide further embodiments. All of the U.S.

patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A flexible display, comprising:
a substrate having a pixel array, a first side, and a second side that faces away from the first side, the pixel array being on the first side;
a metal sheet disposed on the substrate and covering the pixel array;
a first groove in the metal sheet that extends fully from one side to the other side of the metal sheet and has a predetermined depth, the first groove adapted to prevent moisture from entering the pixel array;
a first adhesive layer and a second adhesive layer, the first adhesive layer is coupled to the second side of the substrate, the second adhesive layer is coupled to the metal sheet, and the second adhesive layer is positioned between the metal sheet and the first side of the substrate; and
a back film on the first adhesive layer, the first adhesive layer coupling the back film to the second side of the substrate.

2. The flexible display of claim 1, wherein the first groove extends in a first direction and further comprising:
at least one second groove extending in a second direction intersecting the first direction.

3. The flexible display of claim 2, wherein one of the first direction and the second direction is the same as a direction of a bending axis of the substrate.

4. The flexible display of claim 2, wherein the first direction and the second direction are perpendicular to each other.

5. The flexible display of claim 1, wherein the flexible display has a stack structure in which a plurality of layers is stacked, and includes a neutral surface, a first area positioned on or below the neutral surface, and a second area positioned above or on the neutral surface differently from the first area,
wherein a compressive stress is applied to the first area, and a tensile stress is applied to the second area, and
wherein a position of the neutral surface in a formation area of the first groove is different from a position of the neutral surface in a non-formation area of the first groove.

6. The flexible display of claim 5, wherein the plurality of layers includes a display element layer including an organic light emitting diode, and
wherein in the formation area of the first groove, the display element layer is positioned on the neutral surface or positioned in the first area.

7. The flexible display of claim 1, wherein the pixel array of the substrate includes regions that have pixels and regions that do not have pixels and the first groove is positioned over and aligned with a plurality of regions that include pixels.

8. A flexible display, comprising:
a substrate having a pixel array, the pixel array including emission portions, and non-emission portions positioned outside the emission portions;
a metal sheet disposed on the substrate and covering the pixel array;
a first groove in the metal sheet, the first groove being partially recessed inward from an upper surface of the metal sheet and extending in a first direction along the entire metal sheet from a first side to a second side opposite to the first side of the metal sheet;
wherein the metal sheet is an encapsulation layer to prevent moisture from entering the pixels of the pixel array;
wherein the first groove forms a moisture discharge path; and
wherein the first groove is disposed at a location corresponding to the emission portions disposed along the first direction.

9. The flexible display of claim 8, wherein the metal sheet further includes at least one nth groove that is partially recessed inward from the upper surface of the metal sheet and is extended in a direction inclined from the first direction and the second direction at a predetermined angle to penetrate opposite sides of the metal sheet, where n is a natural number equal to or greater than 3.

10. The flexible display of claim 8, wherein a width of the first groove corresponds to a width of the emission portion.

11. The flexible display of claim 8, wherein a portion of the metal film that is not a groove is positioned over the non-emission portions of the pixel array.

12. The flexible display of claim 8, wherein the pixel array includes emission portions, and non-emission portions positioned outside the emission portions, and
wherein the second groove is disposed at a location corresponding to the emission portions disposed along the second direction.

13. The flexible display of claim 12, wherein a width of the second groove corresponds to a width of the emission portion.

14. A flexible display, comprising:
a substrate having a pixel array, the pixel array including emission portions along a first direction;
a metal sheet disposed on the substrate and covering the pixel array, the metal sheet having a first side and second side spaced from the first side and continuous portion that extends as single, continuous member from the first side and second side;
a first groove above the continuous portion that extends as a recess from an upper surface of the metal sheet to the continuous portion, the first groove having a predetermined depth, the first groove being aligned with the emission portions of the pixel array at a location corresponding to the emission portions disposed along the first direction, and the first groove being adapted to prevent moisture from entering the pixels of the pixel array.

15. The flexible display of claim 14, wherein the flexible display has a stack structure in which a plurality of layers is stacked, and includes a neutral surface, a first area positioned on or below the neutral surface, and a second area positioned above or on the neutral surface differently from the first area,
wherein a compressive stress is applied to the first area when the display is flexed in a first direction, and a tensile stress is applied to the second area when the display is flexed in the first direction, and wherein a position of the neutral surface in a formation area of the groove is different from a position of the neutral surface in a non-formation area of the groove.

16. The flexible display of claim 15, wherein the plurality of layers includes a display element layer including an organic light emitting diode, and wherein in the formation area of the groove, the display element layer is positioned on the neutral surface or positioned in the first area.

17. The flexible display of claim 14, wherein the pixel array further includes non-emission portions positioned outside the emission portions.

* * * * *